United States Patent
Chang

(10) Patent No.: US 6,720,270 B1
(45) Date of Patent: Apr. 13, 2004

(54) METHOD FOR REDUCING SIZE OF SEMICONDUCTOR UNIT IN PACKAGING PROCESS

(75) Inventor: Chin-Huang Chang, Tai-Ping (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/660,753

(22) Filed: Sep. 13, 2000

(51) Int. Cl.⁷ .............................. H01L 21/302
(52) U.S. Cl. ..................... 438/706; 438/55; 438/64; 438/108; 438/708; 438/712; 438/718; 216/58; 216/66
(58) Field of Search .................... 438/55, 64, 108, 438/708, 706, 718, 710, 712, 53, 106, 107; 216/58, 66

(56) References Cited

U.S. PATENT DOCUMENTS

| | | | | |
|---|---|---|---|---|
| 4,872,945 A | * | 10/1989 | Myer et al. ............... | 156/345 |
| 5,532,189 A | * | 7/1996 | Kiyono ..................... | 438/209 |
| 5,656,552 A | * | 8/1997 | Hudak et al. .............. | 438/15 |
| 6,069,366 A | * | 5/2000 | Goruganthu et al. ... | 250/559.27 |
| 6,074,895 A | * | 6/2000 | Dery et al. ................ | 438/108 |
| 6,184,060 B1 | * | 2/2001 | Siniaguine ................ | 438/106 |
| 6,355,569 B1 | * | 3/2002 | Shimizu et al. ........... | 438/706 |
| 6,417,068 B1 | * | 7/2002 | Bruce et al. .............. | 438/401 |

\* cited by examiner

Primary Examiner—Lan Vinh
(74) Attorney, Agent, or Firm—Klarquist Sparkman, LLP

(57) ABSTRACT

The present invention provides different schemes for reducing the size (such as thickness) of at least a semiconductor unit (such as an IC chip) which is to be packaged. It replaces, in packaging at least a semiconductor unit, conventional grinding processes by etching schemes, particularly when the thickness of the semiconductor unit approximates an expected specification. The etching process may be embodied in a way that a semiconductor unit attached to a carrier such as a substrate, or placed onto a seating apparatus such as a chip tray, and properly shielded, is etched by means of using gas such as plasma, or beams of light. The semiconductor unit packaged according to the scheme provided by the present invention can thus be immunized against the failure resulting from die crack or back-side chipping.

20 Claims, 4 Drawing Sheets

METHOD FOR REDUCING SIZE OF SEMICONDUCTOR UNIT IN PACKAGING PROCESS

FIELD OF THE INVENTION

The present invention relates to schemes of reducing the size of at least a semiconductor unit, particularly to technologies of reducing the size of at least a semiconductor unit in packaging the semiconductor unit.

BACKGROUND OF THE INVENTION

In conventional processes of packaging an IC chip, back-side grinding of a wafer is the first step which is followed by wafer sawing to divide a wafer into a plurality of dice, and the dice are then attached to substrates. According to such conventional processes, grinding on the basis of mechanical force is still applied to a chip even when the thickness of the chip approximates an expected specification, resulting in the fact that the chip tends to suffer from back-side chipping. This result is particularly serious in case the expected specification of the thickness of the chip is relatively small. Furthermore, a chip so ground as to have a critical thickness (such as 6 mil or below) tends to suffer from die crack, and the process of back-side grinding of a chip, particularly when the thickness of the chip approximates the expected specification, always involves petty but indispensable procedures. It can thus be concluded that the cost optimization for such conventional IC packaging processes and the quality stabilization of product therein can never be realized due to the need thereof for complicated and petty procedures, and the significant failure rate inherent therein resulting from back-side chipping and die crack.

To provide solutions to the above problems which are associated with conventional chip packaging processes, the present invention develops new schemes for reducing the size of a chip, which features replacing conventional back-grinding of a chip by the etching on a surface of the chip, particularly during the phase the thickness of the chip reaches a range of 8~10 mil, thereby the failure rate of process of packaging at least a chip can be significantly lowered, and the petty procedures involved by grinding a thin chip can be abridged.

SUMMARY OF THE INVENTION

An object of the present invention is to provide a method for reducing the size of a semiconductor unit, in order to immunize semiconductor unit packaging processes against the back-side chipping resulting from back-side grinding of a thin chip, and the die crack resulting from sawing a wafer, or handling, or processing, or connecting a chip.

Another object of the present invention is provide a method for reducing the size of a semiconductor unit, in order to eliminate the need of petty procedures in grinding a thin wafer.

A further object of the present invention is to provide different etching modes for industries to select, according to individual product or condition, better scheme for reducing the size of at least a semiconductor unit in the processes of packaging at least a semiconductor unit, thereby the cost of an IC package can be economized, and the stable product quality thereof can be reliably sustained.

The primary difference between the present invention and those conventional arts of packaging a chip is briefed as follows: according to those conventional arts, the size of a chip/die is reduced by grinding on the basis of mechanical force throughout the whole process of packaging a chip/die; while according to the present invention, the size of at least a semiconductor unit is reduced by etching the semiconductor unit, particularly when the thickness of the semiconductor unit approximates an expected specification (such as the thickness in the range spanning between 8 mil and 10 mil).

The present invention is characterized by using a certain type of gas (plasma, for example) or beams of light to etch at least a thin semiconductor unit until the size of the semiconductor unit meets an expected specification (such as the thickness thereof ranging from 2 mil to 6 mil), thereby IC packaging processes can be immunized against the high failure rate resulting from back-side chipping of a thin chip and die crack.

An aspect of the present invention for reducing the size of at least a semiconductor unit in a process of packaging the semiconductor unit may be a method comprising the steps of:

(A) attaching at least a part of a first surface of the semiconductor unit to a carrier such as a chip carrier (a substrate, for example) or a chip tray; and (B) etching the semiconductor unit from a second surface of the semiconductor unit until the size of the semiconductor unit meets an expected specification.

In the process of reducing the size of semiconductor unit according to the above method, the semiconductor unit has its semiconductor electrical connection device such as a pin located on its first surface, and the semiconductor unit may be etched by means selected from among using gas and using beams of light. A preferred embodiment is to etch the semiconductor unit by using plasma.

In the process of reducing the size of semiconductor unit according to the above method, the expected specification may mean that the thickness of the semiconductor unit measured relative to the first surface is within a specified range, and the specified range may be a range spanning between 2 mil and 6 mil, for example. If the initial thickness of the semiconductor unit is too much larger than the specified range, back-side grinding of the semiconductor unit may be used to reduce the size of the semiconductor unit until the thickness of the semiconductor unit approximates the specified range, such as the range spanning between 8 mil and 10 mil. In the range spanning between 8 mil and 10 mil, grinding on the basis of mechanical force tends to result in high failure rate, and therefore is replaced by the etching process characterizing the present invention.

The above method is suitable for packaging at least a semiconductor unit that, after attaching to the chip carrier, has at least a surface from which the semiconductor unit may be etched. For example, a flip chip with a surface thereof connected with the chip carrier via bumps may have another surface from which the flip chip may be etched, or in a lead-on chip package a chip having part of its first surface stuck to the chip carrier and its bonding wires electrically connected to the chip carrier may have its second surface for etching the chip. The meaning of "attaching" throughout this disclosure includes "placing", and the semiconductor unit may also be properly placed onto a chip tray instead of a chip carrier.

Another aspect of the present invention for reducing the size of at least a semiconductor unit in a process of packaging the semiconductor unit which includes a first surface, a second surface, and at least a semiconductor electrical connection device located on the first surface, may be a method comprising the steps of:

(C) attaching the semiconductor unit to a seating apparatus such as a chip tray, or a chip carrier mechanically or/and electrically connectible with said semiconductor unit, the fast surface thereof facing the seating apparatus and the second surface thereof exposed; and (D) etching the semiconductor unit from its second surface until the size of the semiconductor unit meets an expected specification, thereby the method provided by the present invention can be suitable for various IC package structures, as can be seen from detailed descriptions hereinafter.

The present invention may best be understood through the following description with reference to the accompanying drawings, in which:

DETAILED DESCRIPTION OF THE PREFERRED EMBODIMENTS

Figure 1:
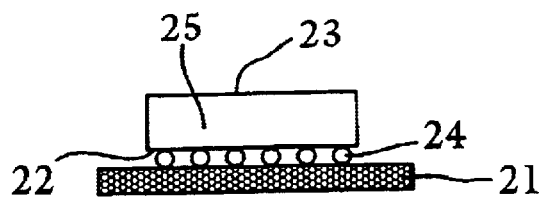
FIG. 1 shows an embodiment of a main step of a method provided by the present invention for reducing the size of a semiconductor unit such as flip chip.

FIG. 1 shows a main step (A) of a method provided by the present invention for reducing the size of at least a semiconductor unit. According to FIG. 1, a semiconductor unit 25 includes a first surface 22 and a second surface 23, wherein second surface 23 has not yet been ground or has been so ground that the semiconductor unit 25 has its size approximating an expected specification such as a desired thickness, and the semiconductor unit 25 attaches to or electrically connects a carrier 21 such as a substrate via bump 24. For an example of the size of semiconductor unit 25 approximating the expected specification, the expected specification may be a thickness ranging from 2 mil to 6 mil, and the semiconductor unit 25 has been ground to have a thickness ranging between 8 mil and 10 mil.

Figure 2:
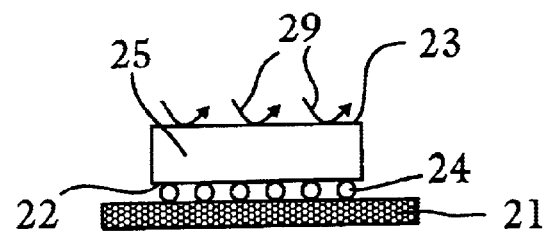
FIG. 2 shows an embodiment of another main step of a method provided by the present invention for reducing the size of a semiconductor unit such as flip chip.

FIG. 2 shows another main step (B) of a method provided by the present invention for reducing the size of at least a semiconductor unit. According to FIG. 2, semiconductor unit 25 is etched from second surface 23 by means 29 selected from among using a certain type of gas, or plasma, or beams of light.

Figure 3:
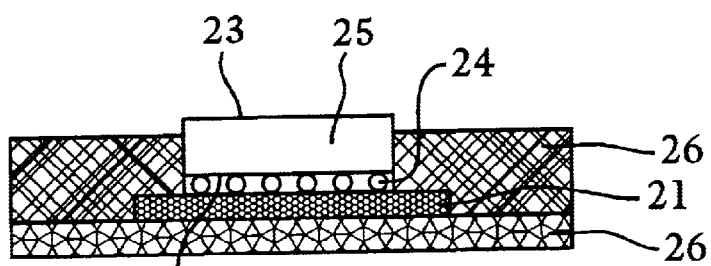
FIG. 3 shows a structure in which a fixture is used to shield those shown in FIG. 1 in order to prevent product quality from being affected by etching process.

To prevent etching process from affecting the quality or functions of carrier 21 and semiconductor unit 25 (to prevent the first surface 22 of semiconductor unit 25 or the bump 24 from being etched, for example), an embodiment shown in FIG. 3 is preferred. In FIG. 3, a fixture 26 is used to properly shield carrier 21 and semiconductor unit 25. For example, most part of carrier 21, the first surface 22 of semiconductor unit 25, and the bump 24 in FIG. 3 are shielded by fixture 26, and thereby are immunized against etching, whereby etching process can take effect only on the second surface 23 of semiconductor unit 25, as can be seen from FIG. 4.

Figure 4:
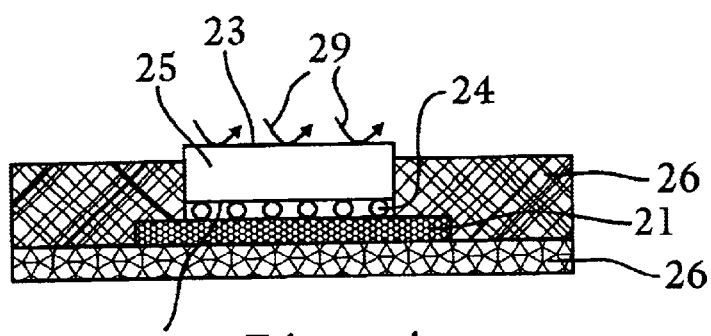
FIG. 4 depicts an etching process.
Figure 5:
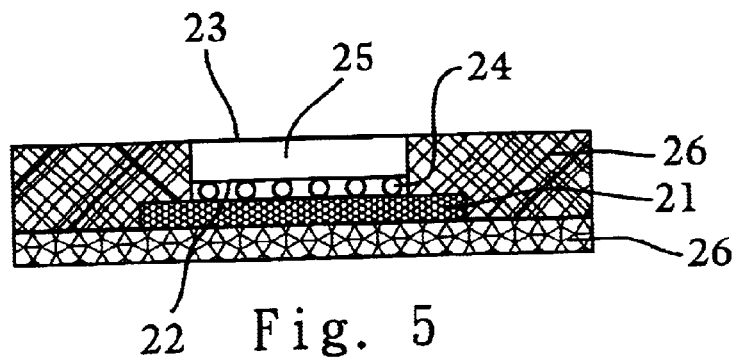
FIG. 5 shows a cross sectional view of the structure where a semiconductor unit has been so etched according to the present invention as to have thickness reaching a range spanning between 2 mil and 6 mil.

FIG. 5 depicts the semiconductor unit 25 having been etched according to FIG. 4 to have a size meeting an expected specification, and therefore requiring no more etching. For example, the expected specification is a thickness ranging between 2 mil and 6 mil and measured relative to the first surface 22, and the semiconductor unit 25 needs no more etching when its thickness measured relative to surface 22 reaches the range which is between 2 mil and 6 mil. More is to be depicted according to FIG. 6.

Figure 6:
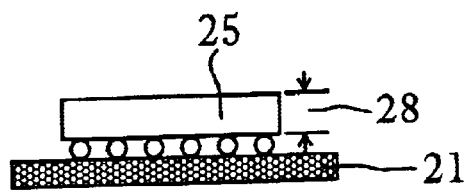
FIG. 6 shows a product achieved by reducing the size of a semiconductor unit (such as a flip chip) according to the present invention.

As the size of semiconductor unit 25 in FIG. 5 has met the expected specification, fixture 26 is moved away, and a package including semiconductor unit 25 and carrier 21 is thus obtained, as shown in FIG. 6. In FIG. 6, the thickness of semiconductor unit 25 meeting the expected specification is indicated by 28 which, based on the above example, is between 2 mil and 6 mil.

Figure 7:
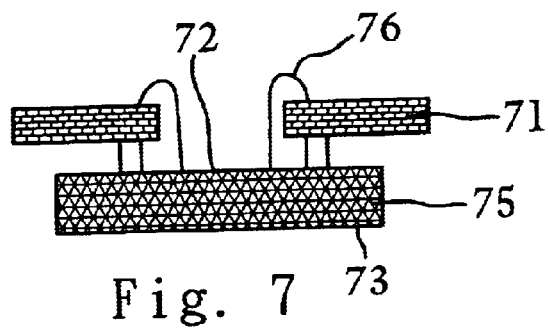
FIG. 7 shows another chip package structure to which the method of reducing the size of at least a semiconductor unit (such as a wire bonding chip) according to the present invention may be applicable.
Figure 8:
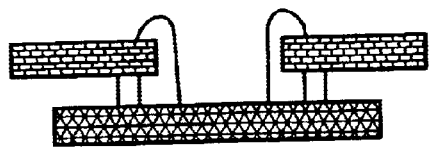
FIG. 8 shows a result after applying schemes provided by the present invention to the IC package (lead-on chip package) shown in FIG. 7.

The method provided by the present invention and defined according to FIGS. 3~5 may also be applied to the package structure (lead-on chip package) shown in FIG. 7. FIG. 7 differs from FIG. 1 in that the semiconductor unit 75 in FIG. 7 is a wire bonding chip stuck to carrier 71 via adhesive material. Just shield the carrier 71 and semiconductor unit 75 shown in FIG. 7 according to the same way as shown in FIG. 3, the etching process can take effect only on the second surface 73 of semiconductor unit 75, and the steps defined by FIGS. 4~6 can also be applicable to size reduction of the semiconductor unit shown in FIG. 7 for obtaining a package structure shown in FIG. 8.

The bonding wire 76 in FIG. 7 may be installed to electrically connect semiconductor unit 75 and carrier 71 after the etching process and the removal of fixture, or before the etching process if it can be immunized against the etching process.

Figure 9:
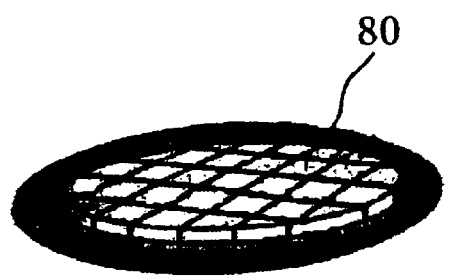
FIG. 9 shows a wafer divided into a plurality of dice.
Figure 10:
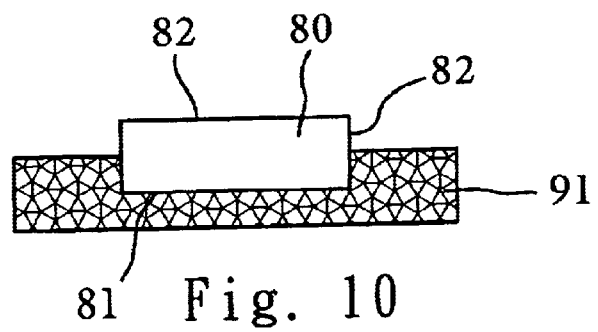
FIG. 10 shows a cross sectional view of a die placed onto a seating apparatus, to be reduced in size according to the present invention.
Figure 11:
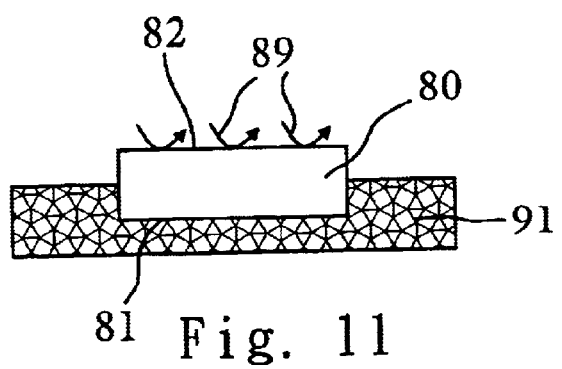
FIG. 11 shows a cross sectional view of a semiconductor unit placed onto a seating apparatus and being etched according to the present invention.
Figure 12:
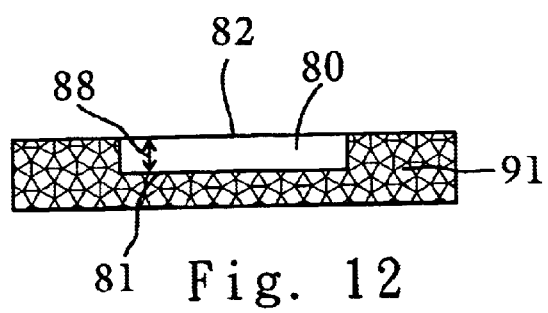
FIG. 12 shows a cross sectional view of a semiconductor unit placed onto a chip tray and having been etched, according to the present invention, to have a thickness reaching a specified range.

Another aspect of the method provided by the present invention for reducing the size of at least a semiconductor unit may be depicted by the embodiments shown in FIGS. 9~15. In FIG. 9, a wafer is divided into a plurality of dice among which at least a die 80 has its size to be reduced according to a method provided by the present invention. FIGS. 10~12 show essential steps provided by the present invention for reducing the size of at least a die 80 shown in FIG. 9.

Figure 13:
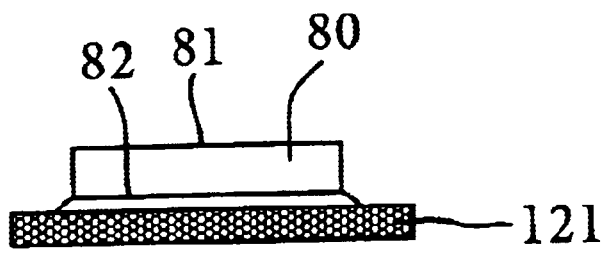
FIG. 13 shows a scheme of attaching, according to the present invention, a semiconductor unit to a carrier after moving the semiconductor unit out from a chip tray.
Figure 14:
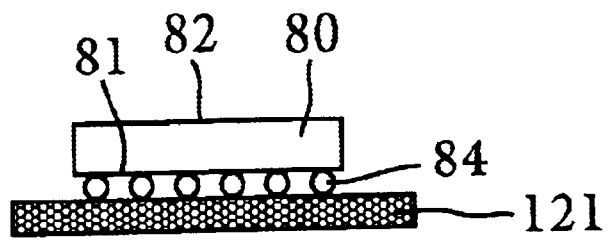
FIG. 14 shows another scheme of attaching, according to the present invention, a semiconductor unit to a carrier after moving the semiconductor unit out from a chip tray.
Figure 15:
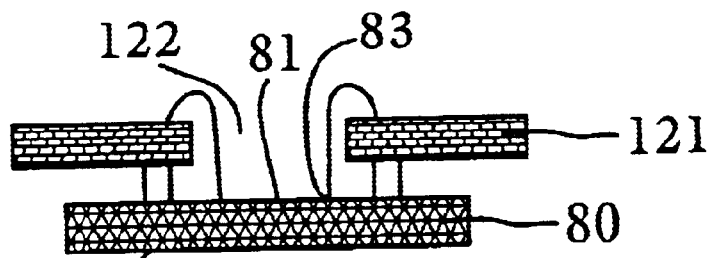
FIG. 15 shows a further scheme of attaching, according to the present invention, a semiconductor unit to a carrier after moving the semiconductor unit out from a chip tray.

In FIG. 10, die 80 is attached to a seating apparatus 91 (a chip tray, for example) or an apparatus including a suitable tray onto which die 80 may be placed, or a carrier such as a chip carrier mechanically and/or electrically connectible with the semiconductor unit 80, the first surface 81 of the semiconductor unit (die 80) faces the seating apparatus and the second surface 82 thereof is exposed. As shown in FIG. 11, semiconductor unit (die 80) is etched from its second surface 82 by means 89 until its size meets an expected specification. For example, when the thickness of the semiconductor unit 80 measured relative to its first surface 81 becomes to be within a range of 2 mil 6 mil, the etching process ends, as may be represented by FIG. 12. The etched semiconductor unit 80 in FIG. 12 is then moved out from apparatus 91 to stick to a carrier 121 via its second surface 82 as shown in FIG. 13 if the semiconductor unit 80 connects a carrier in a conventional mode, or to have its first surface 81 connected to a carrier 121 via a bump 84 as shown in FIG. 14 if the semiconductor unit 80 is a flip chip, or to have its first surface 81 stuck to carrier 121 and its electrical connection device 83 (located on first surface 81) exposed to an opening 122 of carrier 121 as shown in FIG. 15 if the semiconductor unit 80 is to be packaged in a structure of Lead On Chip. In case the seating apparatus is a carrier mechanically and/or electrically connectible with the semiconductor unit 80, the semiconductor unit 80 may be connected to the seating apparatus before the etching process, and requires no steps of moving the semiconductor unit to another carrier after the etching process.

The etching process according to FIG. 11 may be implemented by means 89 of using a certain type of gas, or beams of light. A preferred embodiment according to the present invention is to etch the semiconductor unit 80 by means of using plasma. The expected specification in the above embodiments may mean that the thickness of the semiconductor unit 80 measured relative to the first surface 81 is within a specified range (between 2 mil and 6 mil, for example). The first surface 81 in FIG. 11 is immunized against the etching process by the shielding provided by the seating apparatus 91.

In the above embodiments of the present invention, if the initial size of the semiconductor unit is much larger than the expected specification (initial thickness is much larger than 10 mil while expected thickness is 6 mil, for example), a preferred embodiment of the method provided by the present invention for an application to packaging at least a semiconductor unit is to etch the semiconductor unit only after a step of reducing, on the basis of mechanical force such as grinding, the size of the semiconductor unit until the thickness of the semiconductor unit approximates the expected specification. For example, when the thickness reaches a range which spans from 8 mil to 10 mil.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for reducing the thickness of an entire semiconductor chip or die in a process of making a package including a carrier and said semiconductor chip or die, said semiconductor chip or die including a first surface and a second surface, said second surface having no electrical connection device thereon, said carrier being physically separate from said semiconductor chip or die, said method comprising:

attaching permanently at least a part of said first surface to said carrier according to a configuration of lead-on-chip packaging; and etching said semiconductor chip or die from said second surface to reduce the thickness of said semiconductor chip or die until the thickness of said semiconductor chip or die meets an expected specification.

2. The method according to claim 1 wherein said semiconductor chip or die is etched by using beams of light.

3. The method according to claim 1 wherein said semiconductor chip or die is etched by using plasma.

4. The method according to claim 1 wherein said expected specification means that the thickness of said semiconductor chip or die measured relative to said first surface is within a specified range.

5. The method according to claim 1 wherein said semiconductor chip or die is a wire bonding chip.

6. The method according to claim 1 wherein etching comprises a step of shielding at least a part of said semiconductor chip or die and said carrier to prevent the quality of said semiconductor chip or die and said carrier from being affected.

7. The method according to claim 1 further comprising, before attaching, grinding said semiconductor chip or die until the size thereof approximates said expected specification.

8. The method according to claim 1 wherein etching comprises using a fixture to shield at least a part of said semiconductor chip or die and said carrier for preventing the quality of said semiconductor chip or die and said carrier from being affected.

9. The method according to claim 1 wherein said semiconductor chip or die is a wire bonding chip and is partly attached to said carrier via adhesive material.

10. The method according to claim 1 wherein said carrier is a chip carrier, said semiconductor chip or die includes at least an electrical connection device located on said first surface, and attaching includes connecting said electrical connection device to said chip carrier.

11. A method for reducing the thickness of an entire semiconductor chip or die in a process of lead-on-chip packaging wherein said semiconductor chip or die includes a first surface and a second surface, said first surface having at least an electrical connection device thereon, said second surface having no electrical connection device thereon, said method comprising:

attaching permanently said semiconductor chip or die to a carrier that is physically separate from said semiconductor chip or die, with said semiconductor chip or die and said carrier in a configuration of lead-on-chip, said first surface facing said carrier, and said second surface exposed; and etching said semiconductor chip or die from said second surface to reduce the thickness of said semiconductor chip or die until the thickness of said semiconductor chip or die meets an expected specification.

12. The method according to claim 11 wherein etching includes applying beams of light on said second surface.

13. The method according to claim 11 further comprising, before attaching, grinding said semiconductor chip or die until the size of said semiconductor chip or die approximates said expected specification.

14. The method according to claim 11 wherein said expected specification means that the thickness of said semiconductor chip or die measured relative to said first surface is within a specified range.

15. The method according to claim 11 wherein said first surface is connectible with said chip carrier via adhesive material and said semiconductor chip or die is electrically connectible with said chip carrier via said electrical connection device.

16. The method according to claim 11 wherein attaching includes a step of connecting at least part of said first surface to said carrier via adhesive material.

17. The method according to claim 11 wherein etching comprises shielding at least part of said semiconductor chip or die and said carrier to prevent the quality of said semiconductor chip or die and said carrier from being affected.

18. The method according to claim 11 further comprising electrically connecting said semiconductor chip or die to said carrier via said electrical connection device after etching.

19. A method for reducing the thickness of an entire semiconductor chip or die in a process of packaging said semiconductor chip or die wherein said semiconductor chip or die includes a first surface and a second surface, said second surface having no electrical connection device thereon, said method comprising:

attaching permanently at least a part of said first surface to a carrier that is physically separate from said semiconductor chip or die;

using a temporary, moveable fixture to surround said carrier and said semiconductor chip or die while exposing said second surface; and etching said semiconductor chip or die from said second surface to reduce the thickness of said semiconductor chip or die until the thickness of said semiconductor chip or die meets an expected specification.

20. The method according to claim 19 wherein said carrier and said semiconductor chip or die are surrounded in such a way that said carrier and said semiconductor chip or die are shielded from etching except said second surface.

* * * * *